US 6,668,636 B2

(12) United States Patent
Nantz et al.

(10) Patent No.: US 6,668,636 B2
(45) Date of Patent: Dec. 30, 2003

(54) SYSTEM AND METHOD FOR TIRE PRESSURE MONITORING INCLUDING TIRE LOCATION RECOGNITION

(75) Inventors: John S. Nantz, Brighton, MI (US); Qingfeng Tang, Novi, MI (US); Ronald O. King, Brownstown, MI (US); Riad Ghabra, Dearborn Heights, MI (US); Keith Walker, Redford, MI (US); Thomas Bejster, Dearborn, MI (US); Bruce Conner, Ann Arbor, MI (US); Qing Li, Canton, MI (US); Art Turovsky, Southfield, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 10/164,339

(22) Filed: Jun. 5, 2002

(65) Prior Publication Data
US 2003/0164031 A1 Sep. 4, 2003

Related U.S. Application Data
(60) Provisional application No. 60/360,762, filed on Mar. 1, 2002.

(51) Int. Cl.⁷ .............................................. B60C 23/00
(52) U.S. Cl. ..................... 73/146.4; 73/146.5; 340/445
(58) Field of Search ................................ 73/146, 146.2, 73/146.3, 146.4, 146.5; 340/425.5, 438, 442, 443, 445, 446, 447, 448

(56) References Cited

U.S. PATENT DOCUMENTS

| 3,580,353 A | 5/1971 | Thompson |
| 3,723,966 A | 3/1973 | Mueller et al. |
| 3,916,688 A | 11/1975 | Dendy et al. |
| 4,067,235 A | 1/1978 | Markland et al. |
| 4,101,870 A | 7/1978 | Ekman |
| 4,330,774 A | 5/1982 | Doty |
| 4,450,431 A | 5/1984 | Hochstein |
| 4,468,650 A | 8/1984 | Barbee |
| 4,570,152 A | 2/1986 | Melton et al. |
| 4,660,528 A | 4/1987 | Buck |
| 4,670,845 A | 6/1987 | Etoh |
| 4,717,905 A | 1/1988 | Morrison, Jr. et al. |
| 4,749,993 A | 6/1988 | Szabo et al. |
| 4,951,208 A | 8/1990 | Etoh |

(List continued on next page.)

FOREIGN PATENT DOCUMENTS

| EP | 1059177 | 12/2000 |
| EP | 1 172 236 | 1/2002 |
| EP | 1 211 104 A2 | 6/2002 |
| FR | 2801728 A | 6/2001 |
| JP | 8244424 | 3/1995 |
| WO | WO 98/26946 | 6/1998 |
| WO | WO 01/26069 A1 | 4/2001 |
| WO | WO 01/69803 | 9/2001 |
| WO | WO 01/81104 A1 | 11/2001 |
| WO | WO 02/057097 | 7/2002 |

Primary Examiner—Eric S. McCall
(74) Attorney, Agent, or Firm—Bill C. Panagos

(57) ABSTRACT

In a system for remote monitoring of vehicle tire pressure, a system and method for identifying tire location. A tire pressure monitor for each tire includes a sensor for sensing tire pressure, a transmitter for transmitting a signal representative of the sensed tire pressure, and a sensor for sensing an impact to the tire and for actuating the transmitter to transmit a tire pressure signal in response. A receiver for mounting on the vehicle receives the tire pressure signals. A controller for mounting on the vehicle communicates with the receiver and is for use in conveying tire pressure and location information to a user. When the vehicle is stationary, each tire is struck in a preselected sequence so that each received tire pressure signal is automatically associated with one of the plurality of tire locations.

20 Claims, 2 Drawing Sheets

U.S. PATENT DOCUMENTS

| | | |
|---|---|---|
| 5,040,561 A | 8/1991 | Achterholt |
| 5,109,213 A | 4/1992 | Williams |
| 5,156,230 A | 10/1992 | Washburn |
| 5,165,497 A | 11/1992 | Chi |
| 5,289,160 A | 2/1994 | Fiorletta |
| 5,444,448 A | 8/1995 | Schuermann et al. |
| 5,451,959 A | 9/1995 | Schuermann |
| 5,461,385 A | 10/1995 | Armstrong |
| 5,463,374 A | 10/1995 | Mendez et al. |
| 5,473,938 A | 12/1995 | Handfield et al. |
| 5,479,171 A | 12/1995 | Schuermann |
| 5,483,827 A | 1/1996 | Kulka et al. |
| 5,485,381 A | 1/1996 | Heintz et al. |
| 5,500,637 A | 3/1996 | Kokubu |
| 4,609,905 A | 9/1996 | Uzzo |
| 5,562,787 A | 10/1996 | Koch et al. |
| 5,573,610 A | 11/1996 | Koch et al. |
| 5,573,611 A | 11/1996 | Koch et al. |
| 5,585,554 A | 12/1996 | Handfield et al. |
| 5,600,301 A | 2/1997 | Robinson, III |
| 5,602,524 A | 2/1997 | Mock et al. |
| 5,654,689 A | 8/1997 | Peyre et al. |
| 5,661,651 A | 8/1997 | Geschke et al. |
| 5,677,667 A | 10/1997 | Lesesky et al. |
| 5,705,746 A | 1/1998 | Trost et al. |
| 5,717,376 A | 2/1998 | Wilson |
| 5,724,028 A | 3/1998 | Prokup |
| 5,728,933 A | 3/1998 | Schultz et al. |
| 5,740,548 A | 4/1998 | Hudgens |
| 5,741,966 A | 4/1998 | Handfield et al. |
| 5,753,809 A | 5/1998 | Ogusu et al. |
| 5,760,682 A | 6/1998 | Liu et al. |
| 5,774,047 A | 6/1998 | Hensel, IV |
| 5,783,992 A | 7/1998 | Eberwine et al. |
| 4,761,830 A | 8/1998 | Izumi |
| 5,822,683 A | 10/1998 | Paschen |
| 5,835,868 A | 11/1998 | McElroy et al. |
| 5,838,229 A | 11/1998 | Robinson, III |
| 5,844,130 A | 12/1998 | Hilgart et al. |
| 5,853,020 A | 12/1998 | Widner |
| 5,880,363 A | 3/1999 | Meyer et al. |
| 5,900,808 A | 5/1999 | Lebo |
| 5,926,087 A | 7/1999 | Busch et al. |
| 5,939,977 A | 8/1999 | Monson |
| 5,942,971 A | 8/1999 | Fauci et al. |
| 5,959,365 A | 9/1999 | Mantini et al. |
| 5,963,128 A | 10/1999 | McClelland |
| 5,999,091 A | 12/1999 | Wortham |
| 6,002,327 A | 12/1999 | Boesch et al. |
| 6,025,777 A | 2/2000 | Fuller et al. |
| 6,034,596 A | 3/2000 | Smith et al. |
| 6,034,597 A | 3/2000 | Normann et al. |
| 6,043,738 A | 3/2000 | Stewart et al. |
| 6,043,752 A | 3/2000 | Hisada et al. |
| 6,053,038 A | 4/2000 | Schramm et al. |
| 6,060,984 A | 5/2000 | Braun et al. |
| 6,087,930 A | 7/2000 | Kulka et al. |
| 6,111,520 A | 8/2000 | Allen et al. |
| 6,112,587 A | 9/2000 | Oldenettel |
| 6,118,369 A | 9/2000 | Boesch |
| 6,127,939 A | 10/2000 | Lesesky et al. |
| 6,169,480 B1 | 1/2001 | Uhl et al. |
| 6,175,302 B1 | 1/2001 | Huang |
| 6,181,241 B1 | 1/2001 | Normann et al. |
| 6,204,758 B1 | 3/2001 | Wacker et al. |
| 6,232,875 B1 | 5/2001 | DeZorzi |
| 6,232,884 B1 | 5/2001 | Gabbard |
| 6,243,007 B1 | 6/2001 | McLaughlin et al. |
| 6,246,317 B1 | 6/2001 | Pickornik et al. |
| 6,252,498 B1 | 6/2001 | Pashayan, Jr. |
| 6,255,940 B1 | 7/2001 | Phelan et al. |
| 6,259,361 B1 | 7/2001 | Robillard et al. |
| 6,259,362 B1 | 7/2001 | Lin |
| 6,275,148 B1 | 8/2001 | Takamura et al. |
| 6,278,363 B1 | 8/2001 | Bezek et al. |
| 6,292,095 B1 | 9/2001 | Fuller et al. |
| 6,304,610 B1 | 10/2001 | Monson |
| 6,340,929 B1 | 1/2002 | Katou et al. |
| 6,408,690 B1 | 6/2002 | Young et al. |
| 6,417,766 B1 | 7/2002 | Starkey |
| 6,489,888 B1 | 12/2002 | Honeck et al. |
| 6,501,372 B2 | 12/2002 | Lin |
| 2001/0008083 A1 | 7/2001 | Brown |
| 2003/0020605 A1 * | 1/2003 | Starkey ...................... 340/447 |

\* cited by examiner

SYSTEM AND METHOD FOR TIRE PRESSURE MONITORING INCLUDING TIRE LOCATION RECOGNITION

CROSS REFERENCE TO RELATED APPLICATION

This application claims the benefit of U.S. provisional application Serial No. 60/360,762, filed Mar. 1, 2002.

BACKGROUND OF THE INVENTION

1. Field of the Invention

The present invention relates generally to wireless vehicle tire pressure monitoring and, more particularly, to a system and method for wireless vehicle tire pressure monitoring that provide for recognition of tire location.

2. Background

It is known in the automotive industry to provide for wireless monitoring of vehicle tire parameters, particularly tire pressure. In such tire pressure monitoring systems, tire pressure sensors and radio frequency (RF) transmitters are mounted inside each tire, typically adjacent the inflation valve stem. In each tire, the tire pressure sensed by the tire pressure sensor is transmitted by the transmitter to a receiver/controller located on-board the vehicle. The tire pressure information delivered to the receiver/controller by the RF signals from the transmitters is subsequently conveyed to a vehicle operator or occupant, typically in the form of a display.

Exemplary tire pressure monitoring systems are described and shown in U.S. Pat. Nos. 6,112,587 and 6,034,597. To recognize the particular tire location (e.g., front left (FL), front right (FR), rear left (RL), rear right (RR)) associated with an RF signal received from a tire transmitter, such tire pressure monitoring systems are programmed in an initialization or sign-up operation. That is, in order to provide a vehicle operator with information specific to each vehicle tire, programming of the tire pressure monitoring system is undertaken by a technician or vehicle owner so that each RF signal from a tire transmitter will be associated with a particular tire location.

Current tire pressure monitoring systems use a magnetic reed switch in each tire for such programming. More particularly, after the on-board vehicle/controller is placed into a program, initialization, or sign-up mode, the magnetic reed switch in each tire is activated by a technician or vehicle owner using a magnet. Such activation causes the tire transmitter in the tire to transmit a tire pressure signal to the controller the vehicle. In that regard, each pressure sensor and/or transmitter has a unique identification code associated therewith, which identification code is transmitted with the tire pressure signal. Using such identification codes, and by following a preselected sequence for activating each magnetic reed switch, the controller associates each tire pressure signal with a particular tire location.

Such a magnet and reed switch programming technique, however, has various problems associated therewith. As is readily apparent, each time the vehicle tires are rotated or changed from their initial locations, this programming technique must be repeated to ensure that the tire pressure monitoring system continues to operate properly by conveying accurate information, including tire location, to the vehicle operator. As a result, and because this programming technique is relatively complex, the possibility of inaccurate operation of the system is increased, particularly if such programming is not performed by a trained technician.

Moreover, in the event the magnet for activating the reed switches is misplaced or lost, the tire pressure monitoring system cannot be properly programmed after tire rotation. The magnet and reed switches are also additional components that generally increase the cost of the tire pressure monitoring system.

These problems can be overcome through the use of additional equipment or devices for use in determining tire locations. For example, multiple antenna, each associated with a particular tire, and/or specialized transmitters may be employed. Such additional equipment or devices, however, add significant cost to a tire pressure monitoring system.

Thus, there exists a need for an improved system and method for identifying tire locations in a tire pressure monitoring system. Such a system and method would be easier and simpler, as well as less expensive than existing system and methods for identifying tire locations. Such a system and method would also provide for accurate identification of tire locations even after tire rotation, without the need for additional equipment or components.

SUMMARY OF THE INVENTION

Accordingly, the present invention provides an improved system and method for vehicle tire pressure monitoring that provide for recognition of tire location.

According to the present invention, then, in a system for remote monitoring of tire pressure in a vehicle having a plurality of tires, each tire having a location, a system is provided for identifying tire location. The system comprises a plurality of tire monitors, each monitor for mounting in one of the plurality of tires, each monitor comprising a sensor for sensing tire pressure, a transmitter for transmitting a signal representative of the sensed tire pressure, and a sensor for sensing an impact to the tire and for actuating the transmitter to transmit a tire pressure signal in response thereto. The system further comprises a receiver for mounting on-board the vehicle for receiving the tire pressure signals transmitted by the transmitters, and a controller for mounting on-board the vehicle and to be provided in communication with the receiver, the controller for processing tire pressure signals received by the receiver and conveying tire pressure and location information to a user. When the vehicle is stationary, each of the plurality of tires is struck in a preselected sequence so that, for each tire, the impact sensor actuates the transmitter to transmit a tire pressure signal and each received tire pressure signal is automatically associated with one of the plurality of tire locations.

Also according to the present invention, in a system for remote monitoring of tire pressure in a vehicle having a plurality of tires, each tire having a location, a method is provided for identifying tire location. The method comprises providing a plurality of tire monitors, each monitor for mounting in one of the plurality of tires, each monitor comprising a sensor for sensing tire pressure, a transmitter for transmitting a signal representative of the sensed tire pressure, and a sensor for sensing an impact to the tire and for actuating the transmitter to transmit a tire pressure signal in response thereto. The method further comprises providing a receiver for mounting on-board the vehicle for receiving the tire pressure signals transmitted by the transmitters, and providing a controller for mounting on-board the vehicle and to be provided in communication with the receiver, the controller for processing tire pressure signals received by the receiver and conveying tire pressure and location information to a user. When the vehicle is stationary, each of the plurality of tires is struck in a preselected sequence so that, for each tire, the impact sensor actuates the transmitter to transmit a tire pressure signal and each received tire pressure signal is automatically associated with one of the plurality of tire locations.

According to an alternative embodiment of the present invention, in a system for remote monitoring of tire pressure in a vehicle having a plurality of tires, each tire having a location, a system is provided for identifying tire location. The system comprises a plurality of tire monitors, each monitor for mounting in one of the plurality of tires, each monitor comprising a sensor for sensing tire pressure, a transmitter for transmitting a signal representative of the sensed tire pressure, and a sensor for sensing an impact to the tire and for actuating the transmitter to transmit a tire pressure signal in response thereto. The system further comprises a receiver for mounting on-board the vehicle for receiving the tire pressure signals transmitted by the transmitters, and a controller for mounting on-board the vehicle and to be provided in communication with the receiver, the controller for processing tire pressure signals received by the receiver and for conveying tire pressure information to a user. To identify a tire location associated with a low tire pressure indiction conveyed by the controller, at least one tire is struck when the vehicle is stationary so that the associated impact sensor actuates the associated transmitter and, if the associated tire pressure signal transmitted represents a low tire pressure, the controller conveys confirmatory information that the at least one tire struck has low pressure.

Also according to an alternative embodiment of the present invention, in a system for remote monitoring of tire pressure in a vehicle having a plurality of tires, each tire having a location, a method is provided for identifying tire location. The method comprises providing a plurality of tire monitors, each monitor for mounting in one of the plurality of tires, each monitor comprising a sensor for sensing tire pressure, a transmitter for transmitting a signal representative of the sensed tire pressure, and a sensor for sensing an impact to the tire and for actuating the transmitter to transmit a tire pressure signal in response thereto. The method further comprises providing a receiver for mounting on-board the vehicle for receiving the tire pressure signals transmitted by the transmitters, and providing a controller for mounting on-board the vehicle and to be provided in communication with the receiver, the controller for processing tire pressure signals received by the receiver and for conveying tire pressure information to a user. To identify a tire location associated with a low tire pressure indiction conveyed by the controller, at least one tire is struck when the vehicle is stationary so that the associated impact sensor actuates the associated transmitter and, if the associated tire pressure signal transmitted represents a low tire pressure, the controller conveys confirmatory information that the at least one tire struck has low pressure.

These and other features and advantages of the present invention will be readily apparent upon consideration of the following detailed description of the invention in conjunction with the accompanying drawings.

DETAILED DESCRIPTION OF THE PREFERRED EMBODIMENTS

Figure 1:
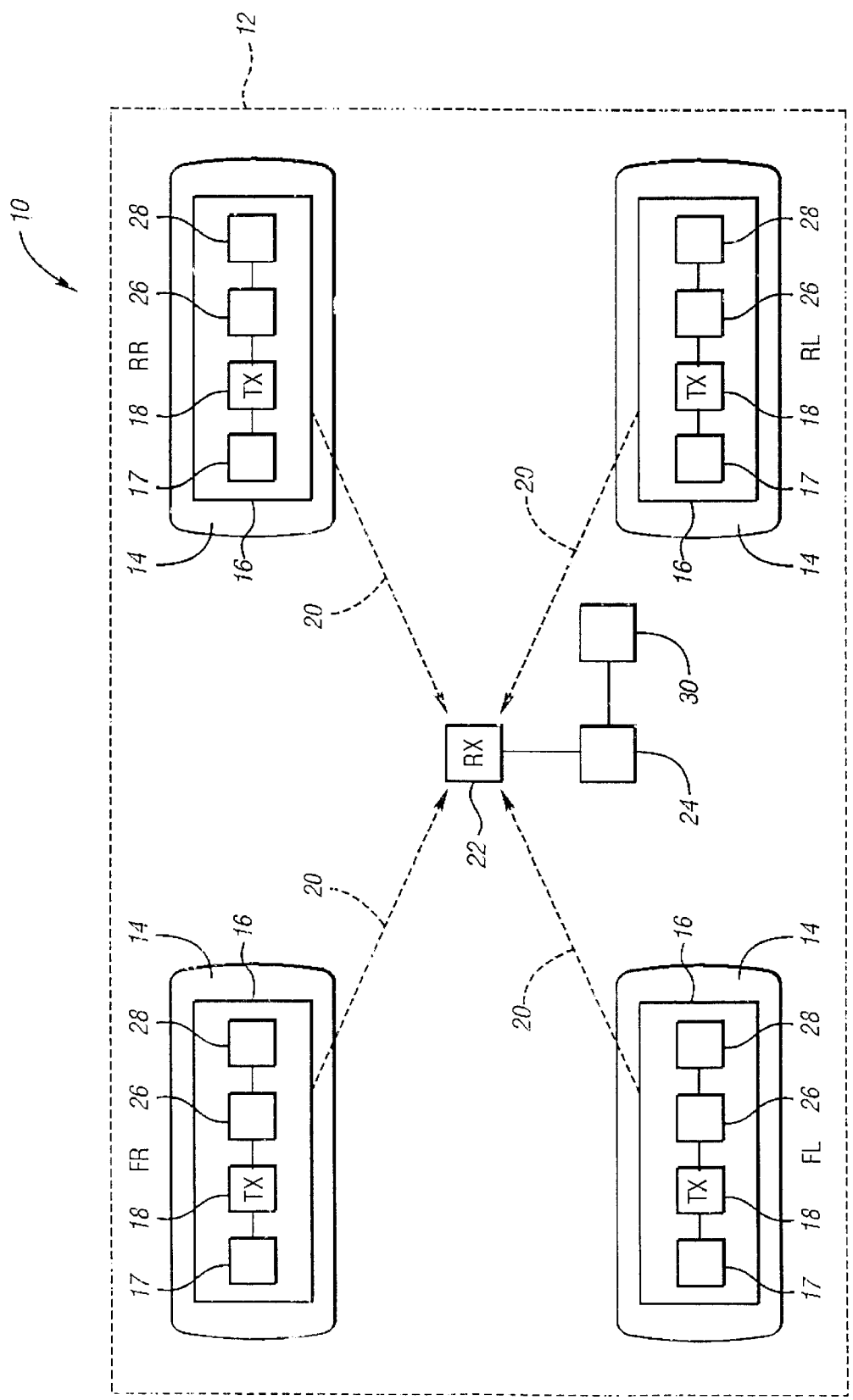
FIG. 1 is a simplified, representative block diagram of the system of the present invention for identifying tire location in a tire pressure monitoring system.

Referring now to the Figures, the preferred embodiments of the present invention will now be described in detail. As previously noted, it is known in the automotive industry to provide for wireless monitoring of vehicle tire parameters, particularly tire pressure. In such tire pressure monitoring systems, tire pressure sensors and radio frequency (RF) transmitters are mounted inside each tire, typically adjacent the inflation valve stem. In each tire, the tire pressure sensed by the tire pressure sensor is transmitted by the transmitter to a receiver/controller located on-board the vehicle. The tire pressure information delivered to the receiver/controller by the RF signals from the transmitters is subsequently conveyed to a vehicle operator or occupant, typically in the form of a display.

As also noted previously, to recognize the particular tire location (e.g., front left (FL), front right (FR), rear left (RL), rear right (RR)) associated with an RF signal received from a tire transmitter, such tire pressure monitoring systems are programmed in an initialization or sign-up operation. That is, in order to provide a vehicle operator with information specific to each vehicle tire, programming of the tire pressure monitoring system is undertaken by a technician or vehicle owner so that each RF signal from a tire transmitter will be associated with a particular tire location.

Current tire pressure monitoring systems use a magnetic reed switch in each tire for such programming. More particularly, after the on-board vehicle/controller is placed into a program, initialization, or sign-up mode, the magnetic reed switch in each tire is activated by a technician or vehicle owner using a magnet. Such activation causes the tire transmitter in the tire to transmit a tire pressure signal to the controller the vehicle. In that regard, each pressure sensor and/or transmitter has a unique identification code associated therewith, which identification code is transmitted with the tire pressure signal. Using such identification codes, and by following a preselected sequence for activating each magnetic reed switch, the controller associates each tire pressure signal with a particular tire location.

As noted above, however, such a magnet and reed switch programming technique has various problems associated therewith. As is readily apparent, each time the vehicle tires are rotated or changed from their initial locations, this programming technique must be repeated to ensure that the tire pressure monitoring system continues to operate properly by conveying accurate information, including tire location, to the vehicle operator. As a result, and because this programming technique is relatively complex, the possibility of inaccurate operation of the system is increased, particularly if such programming is not performed by a trained technician. Moreover, in the event the magnet for activating the reed switches is misplaced or lost, the tire pressure monitoring system cannot be properly programmed after tire rotation. The magnet and reed switches are also additional components that generally increase the cost of the tire pressure monitoring system.

These problems can be overcome through the use of additional equipment or devices for use in determining tire locations. For example, multiple antenna, each associated with a particular tire, and/or specialized transmitters may be employed. Such additional equipment or devices, however, add significant cost to a tire pressure monitoring system.

As a result, there exists a need for an improved system and method for identifying tire locations in a tire pressure monitoring system. Such a system and method would be easier and simpler, as well as less expensive than existing system and methods for identifying tire locations. Such a system and method would also provide for accurate identification of tire locations even after tire rotation, without the need for additional equipment or components.

Referring now to FIG. 1, a simplified, representative block diagram of the system of the present invention for identifying tire location in a tire pressure monitoring system is shown, denoted generally by reference numeral 10. As seen therein, the system (10) is designed for use in a vehicle (12) having a plurality of tires (14). Each one of the plurality of tires (14) has a tire location associated therewith, such as front left (FL), front right (FR), rear left (RL), and rear right (RR). It should be noted here that while the present invention is described herein for use in an automotive vehicle having four tires, such an environment is exemplary only. That is, the present invention is suitable for use in any type of vehicle having any number of tires.

Still referring to FIG. 1, the system (10) includes a plurality of tire monitors (16). Each tire monitor (16) is provided for mounting in one of the plurality of tires (14). In that regard, each tire monitor (16) is preferably located inside the tire (14) adjacent the tire inflation valve stem (not shown), although any mounting location known in the art may be used. Each tire monitor (16) includes an appropriate sensor (17) and/or other devices (not shown), for sensing, determining and/or monitoring at least the pressure of the associated tire (14). It should be noted, however, that each tire monitor (16) may also be equipped to sense, determine and/or monitor any number of tire parameters in addition to pressure including, but not limited to, temperature, status (i.e., whether or not the tire is rotating) and/or speed, in any fashion well known to those of ordinary skill in the art.

Each tire monitor (16) also includes a transmitter (18) in communication with sensor (17) for transmitting a tire pressure signal (20) representative of the sensed tire pressure. In that regard, tire pressure signal (20) is preferably a radio frequency (RF) signal, although other signal types known in the art could be employed. Once again, it should be noted that transmitter (18) may also transmit, as part of or separate from tire pressure signal (20), a signal or signals representative of information concerning any of a number of other tire parameters in addition to pressure such as temperature, status and/or speed as sensed, measured and/or determined by an appropriately equipped tire monitor (16). As will be described in greater detail below, such tire pressure information, together with information concerning any other tire parameters, is ultimately conveyed to a vehicle operator, typically via a visual display, although audible means such as tones or speech may also be used.

Referring still to FIG. 1, the tire pressure monitoring system (10) of the present invention also includes a receiver (22) for mounting on-board the vehicle (12) for receiving the tire pressure signals (20) transmitted by transmitters (18). Receiver (22) comprises one or more antenna (not shown) to be located at one or more selected sites on the vehicle (12).

Still referring to FIG. 1, the system (10) of the present invention further comprises a controller (24) for mounting on-board vehicle (12) and to be provided in communication with receiver (22). Controller (24) is for processing tire pressure signals (20) received by receiver (22) from transmitters (18), preferably to automatically identify the tire location associated with each tire pressure signal (20). Controller (24) is also for generating control signals (not shown) for use in conveying at least tire pressure and preferably tire location information to a vehicle operator, typically via a display unit (30), such as an LED display or a lighted icon in the vehicle dashboard or a vehicle console. Once again, as described above, information concerning other tire parameters, such as temperature, status and/or speed, may also be conveyed to the vehicle operator. It should be noted that the information may also be conveyed to the vehicle operator in an audible fashion, and may include a warning, which may also be audible, if tire pressure and/or other tire parameters, such as temperature, are outside recommended ranges.

Referring still to FIG. 1, each pressure sensor (17) and/or transmitter (18) preferably has a unique identification code associated therewith. Such identification codes serve to particularly associate sensors (17) and/or transmitters (18) with vehicle (12). As a result, such identification codes can facilitate providing the vehicle operator with tire location information. In that regard, each transmitter (18) also preferably transmits such identification code for receipt by receiver (22) and for use by controller (24) in verifying that the tire pressure signals (20) received by receiver (22) are associated with the vehicle (12). Transmitters (18) may transmit the identification codes as part of tire pressure signal (20), or as a separate signal (not shown). In such a fashion, controller (24) disregards any tire pressure signals which may be transmitted from any nearby vehicle and received by receiver (22).

Each tire monitor (16) still further includes an impact or shock sensor (26) and a rotation (or other type of motion) sensor (28) in communication therewith. In each tire (14), impact sensor (26) is also provided in communication with transmitter (18). Rotation sensors (28) are provided for use in determining if the vehicle is stationary by sensing whether or not the associated tire (14) is rotating. Impact sensor (26) senses an impact to the associated tire (14), and, provided the vehicle is stationary (i.e., rotation sensor (28) provides an indication to impact sensor (26) that tire (14) is not rotating), causes the associated transmitter (18) to transmit a tire pressure signal (20). The system (10) may further include a display unit (30) for mounting inside the vehicle, the display unit (30) for use by the controller (24) in conveying information, such as at least tire pressure, and preferably location, to the vehicle operator.

According to the system (10) of the present invention, controller (24) is placed into a program mode. Thereafter, while the vehicle is stationary, each tire (14) is struck, thumped, kicked or hit in a preselected sequence. Such an impact is sensed by impact sensor (26), which, because the vehicle is stationary as indicated by the associated rotation sensor (28), causes the transmitter (18) in the tire (14) to transmit a tire pressure signal (20) to the controller (24). When the vehicle is in motion, again as indicated by the rotation sensors (28), any impact to tires (14) sensed by impact sensors (26) is ignored and does not itself cause transmission of a tire pressure signal (20). In that regard, when the vehicle is in motion, the controller (24) operates in a general or normal operating mode wherein the transmitter (18) in each tire (14) periodically transmits a tire pressure signal (20) to the controller (24). Controller (24) remains in such a general or normal operating mode, even when the vehicle is stationary, until again placed into the program mode. It should be noted that while in such a general or normal operating mode, tire pressure signals (20) may be transmitted by the transmitters (18) in the tires (14) to the controller (24) in any number of fashions, such as periodically as previously mentioned, including transmitting tire pressure signals (20) less frequently when the vehicle is stationary than when the vehicle is in motion.

As previously described, each pressure sensor (17) and/or transmitter (18) has a unique identification code associated therewith, which identification code is transmitted with the tire pressure signal (20). Using such identification codes, and by following the preselected sequence for activating transmitters (18), the controller (24) associates each tire pressure signal (20) received with a particular tire location (e.g., front left (FL), front right (FR), rear left (RL), rear right (RR)).

Each time the vehicle tires (14) are rotated or changed from their initial locations, or when a tire (14) is replaced, such programming is repeated to ensure that the tire pressure monitoring system continues to operate properly by conveying accurate information, including tire location, to the vehicle operator. However, as this programming is relatively simple in comparison to the prior art, the possibility of inaccurate operation of the system is decreased, particularly where such programming is not performed by a trained technician. Moreover, in contrast to the prior art, such programming lacks any additional or separate components that could be misplaced or lost, such that the tire pressure monitoring system cannot be properly programmed after tire rotation, or that increase the cost of the tire pressure monitoring system.

In addition, when tires (14) are not rotating, as indicated by rotation sensors (28), tire monitors (16) can be put into different diagnostic modes by striking, thumping, kicking or hitting the tires (14) a number of times. For example, an impact sensor (26) could sense two kicks within a predetermined short time period, which kicks could cause transmitter (18) to transmit programming information to the controller (24). Similarly, three kicks within a predetermined time period could cause transmission of diagnostic information such as battery status or other information. Preferably, to prevent accessing a software algorithm, programming information would only be sent a limited amount of times.

Still further, current tire pressure monitoring systems show a vehicle operator which tire is outside appropriate operating parameters by displaying, preferably on an instrument panel, the particular location of that tire. This means that the monitoring system has been appropriately programmed to properly indicate the correct location.

Such a problem is also overcome according to the present invention. In particular, after providing a general indication, such as via display unit (30), to an operator that a tire (14) is outside appropriate operating parameters, the present invention provides for identifying the particular location of that tire via an audible or visual signal. More particularly, to identify a tire location associated with a general low tire pressure indiction conveyed by the controller (24), at least one tire (14) is struck, thumped, kicked or hit when the vehicle (12) is stationary so that the associated impact sensor (26) actuates the associated transmitter (18) and, if the associated tire pressure signal (20) transmitted represents a low tire pressure, the controller (24) conveys confirmatory information that the at least one tire (14) struck has low pressure.

In that regard, to convey such confirmatory information, controller (24) is for use in generating an audible and/or visual signal, such as activation of the vehicle horn or a vehicle light (not shown). An indication of low battery power in any tire monitor (16) can be provided in a similar manner. In this fashion, the controller (24) need not be programmed to know particular tire locations. Alternatively, in this manner, specific tire location information conveyed to a vehicle operator by controller (24) via display unit (30) can be verified.

Figure 2:
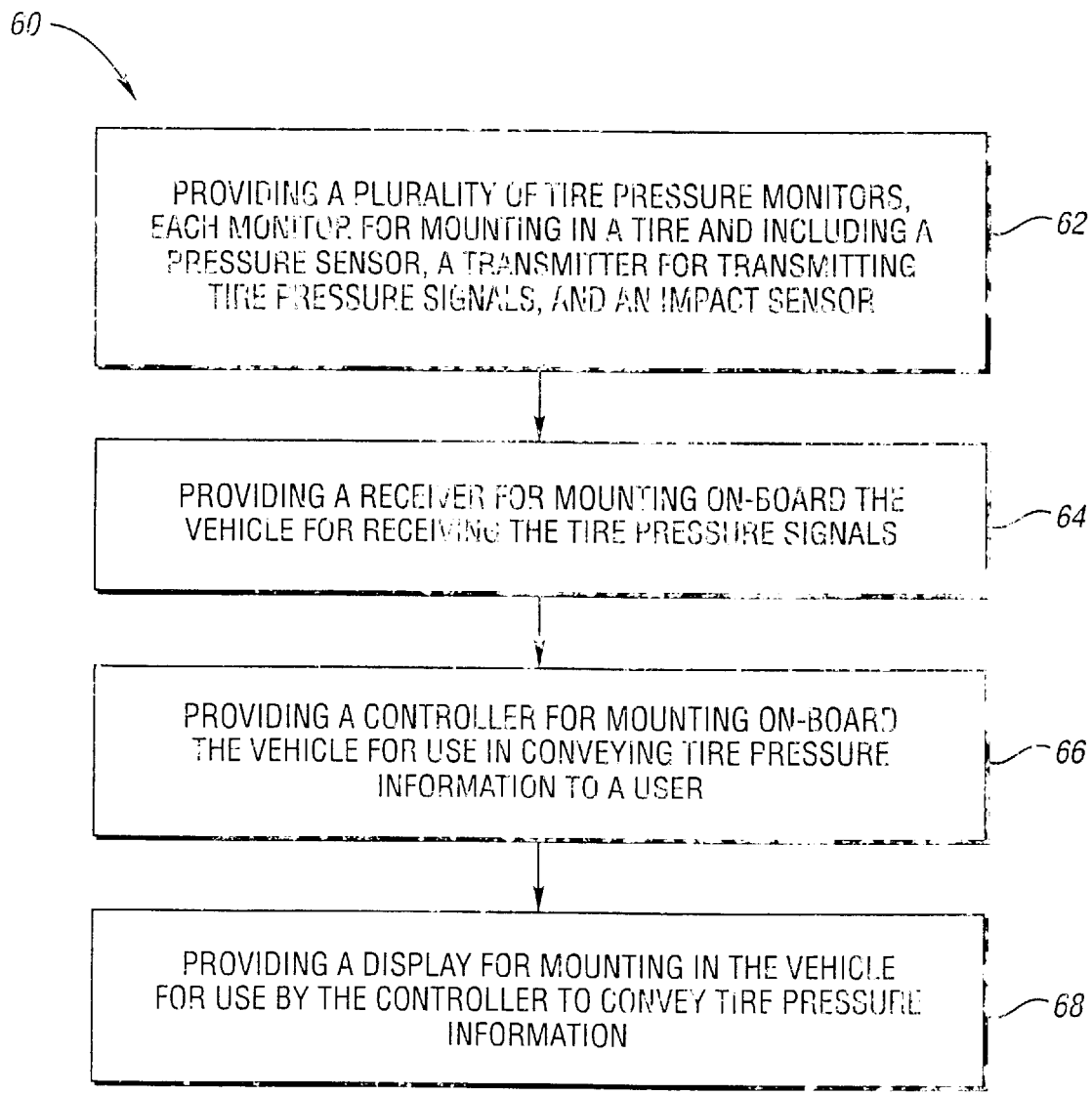
FIG. 2 is a simplified, representative flowchart of the method of the present invention for identifying tire location in a tire pressure monitoring system.

Referring next to FIG. 2, a simplified, representative flowchart of the method of the present invention for identifying tire location in a tire pressure monitoring system is shown, denoted generally by reference numeral 60. The method (60) is for use in a system for remote monitoring of tire pressure in a vehicle having a plurality of tires, each tire having a location, a system for identifying tire location. As seen in FIG. 2, the method (60) comprises providing (62) a plurality of tire monitors, each monitor for mounting in one of the plurality of tires, each monitor comprising a sensor for sensing tire pressure, a transmitter for transmitting a signal representative of the sensed tire pressure, and a sensor for sensing an impact to the tire and for actuating the transmitter to transmit a tire pressure signal in response thereto.

The method (60) of the present invention further comprises providing (64) a receiver for mounting on-board the vehicle for receiving the tire pressure signals transmitted by the transmitters, and providing (66) a controller for mounting on-board the vehicle and to be provided in communication with the receiver. The method (60) may further comprise providing (68) a display for mounting in the vehicle, the display for use by the controller to covey tire pressure and location information to a user According to one embodiment of the method (60) of the present invention, the controller is for processing tire pressure signals received by the receiver and conveying tire pressure and location information to a user, wherein, when the vehicle is stationary, each of the plurality of tires is struck in a preselected sequence so that, for each tire, the impact sensor actuates the transmitter to transmit a tire pressure signal and each received tire pressure signal is automatically associated with one of the plurality of tire locations. According to another embodiment of the method (60) of the present invention, the controller is for processing tire pressure signals received by the receiver and for conveying tire pressure information to a user, wherein, to identify a tire location associated with a low tire pressure indiction conveyed by the controller, at least one tire is struck when the vehicle is stationary so that the associated impact sensor actuates the associated transmitter and, if the associated tire pressure signal transmitted represents a low tire pressure, the controller conveys confirmatory information that the at least one tire struck has low pressure.

It should be noted that the simplified flowchart depicted in FIG. 2 is exemplary of the method (60) of the present invention. In that regard, the steps of such method may be executed in sequences other than those shown in FIG. 2, including the execution of one or more steps simultaneously.

As described in greater detail above, for use in determining when the vehicle is stationary, each tire monitor may further comprise a sensor for sensing tire rotation. In that regard, the impact sensor may actuate the transmitter to transmit a tire pressure signal only in the absence of tire rotation sensed by the rotation sensor. Moreover, each tire pressure sensor and/or transmitter may have an identification associated therewith, and each transmitter is also for transmitting such identification for receipt by the receiver and for use by the controller in identifying the tire pressure signals as associated with a tire location. Such identification may also be used by the controller in identifying the tire pressure signals as associated with the vehicle.

From the foregoing description, it can be seen that the present invention provides an improved system and method for identifying tire locations in a tire pressure monitoring system. In that regard, the system and method of the present invention are less complex, as well as less expensive than existing system and methods for identifying tire locations. Moreover, the system and method of the present invention also provide for accurate identification of tire locations even after tire rotation, without the need for additional equipment or components.

While various embodiments of the invention have been illustrated and described, it is not intended that these embodiments illustrate and describe all possible forms of the present invention. Rather, the words used in the specification are words of description rather than limitation, and it is understood that various changes may be made without departing from the spirit and scope of the invention. Indeed, many alternatives, modifications, and variations will be apparent to those skilled in the art in light of the foregoing description, and the present invention is intended to embrace all such alternatives.

What is claimed is:

1. In a system for remote monitoring of tire pressure in a vehicle having a plurality of tires, each tire having a location, a system for identifying tire location comprising:

a plurality of tire monitors, each monitor for mounting in one of the plurality of tires, each monitor comprising a sensor for sensing tire pressure, a transmitter for transmitting a signal representative of the sensed tire pressure, and a sensor for sensing an impact to the tire and for actuating the transmitter to transmit a tire pressure signal in response thereto;

a receiver for mounting on-board the vehicle for receiving the tire pressure signals transmitted by the transmitters; and a controller for mounting on-board the vehicle and to be provided in communication with the receiver, the controller for processing tire pressure signals received by the receiver and conveying tire pressure and location information to a user, wherein, when the vehicle is stationary, each of the plurality of tires is struck in a preselected sequence so that, for each tire, the impact sensor actuates the transmitter to transmit a tire pressure signal and each received tire pressure signal is automatically associated with one of the plurality of tire locations.

2. The system of claim 1 wherein, for use in determining when the vehicle is stationary, each tire monitor further comprises a sensor for sensing tire rotation, and the impact sensor actuates the transmitter to transmit a tire pressure signal only in the absence of tire rotation sensed by the rotation sensor.

3. The system of claim 2 further comprising a display for mounting in the vehicle, the display for use by the controller to covey tire pressure and location information to a user.

4. The system of claim 1 wherein each tire monitor has an identification associated therewith, and each transmitter is also for transmitting the identification of the associated monitor for receipt by the receiver and for use by the controller in identifying an associated tire location.

5. The system of claim 4 wherein the transmitted identification is also for use by the controller in identifying the tire pressure signals as associated with the vehicle.

6. In a system for remote monitoring of tire pressure in a vehicle having a plurality of tires, each tire having a location, a system for identifying tire location comprising:

a plurality of tire monitors, each monitor for mounting in one of the plurality of tires, each monitor comprising a sensor for sensing tire pressure, a transmitter for transmitting a signal representative of the sensed tire pressure, and a sensor for sensing an impact to the tire and for actuating the transmitter to transmit a tire pressure signal in response thereto;

a receiver for mounting on-board the vehicle for receiving the tire pressure signals transmitted by the transmitters; and a controller for mounting on-board the vehicle and to be provided in communication with the receiver, the controller for processing tire pressure signals received by the receiver and for conveying tire pressure information to a user, wherein, to identify a tire location associated with a low tire pressure indiction conveyed by the controller, at least one tire is struck when the vehicle is stationary so that the associated impact sensor actuates the associated transmitter and, if the associated tire pressure signal transmitted represents a low tire pressure, the controller conveys confirmatory information that the at least one tire struck has low pressure.

7. The system of claim 6 wherein to convey confirmatory information, the controller is for use in generating an audible signal.

8. The system of claim 7 wherein the audible signal comprises activating a vehicle horn.

9. The system of claim 6 wherein to convey confirmatory information, the controller is for use in generating a visual signal.

10. The system of claim 9 wherein the visual signal comprises activating a vehicle light.

11. In a system for remote monitoring of tire pressure in a vehicle having a plurality of tires, each tire having a location, a method for identifying tire location comprising:

providing a plurality of tire monitors, each monitor for mounting in one of the plurality of tires, each monitor comprising a sensor for sensing tire pressure, a transmitter for transmitting a signal representative of the sensed tire pressure, and a sensor for sensing an impact to the tire and for actuating the transmitter to transmit a tire pressure signal in response thereto;

providing a receiver for mounting on-board the vehicle for receiving the tire pressure signals transmitted by the-transmitters; and providing a controller for mounting on-board the vehicle and to be provided in communication with the receiver, the controller for processing tire pressure signals received by the receiver and conveying tire pressure and location information to a user, wherein, when the vehicle is stationary, each of the plurality of tires is struck in a preselected sequence so that, for each tire, the impact sensor actuates the transmitter to transmit a tire pressure signal and each received tire pressure signal is automatically associated with one of the plurality of tire locations.

12. The method of claim 11 wherein, for use in determining when the vehicle is stationary, each tire monitor further comprises a sensor for sensing tire rotation, and the impact sensor actuates the transmitter to transmit a tire pressure signal only in the absence of tire rotation sensed by the rotation sensor.

13. The method of claim 12 further comprising providing a display for mounting in the vehicle, the display for use by the controller to covey tire pressure and location information to a user.

14. The method of claim 11 wherein each tire monitor has an identification associated therewith, and each transmitter is also for transmitting the identification of the associated monitor for receipt by the receiver and for use by the controller in identifying an associated tire location.

15. The method of claim 14 wherein the transmitted identification is also for use by the controller in identifying the tire pressure signals as associated with the vehicle.

16. In a system for remote monitoring of tire pressure in a vehicle having a plurality of tires, each tire having a location, a method for identifying tire location comprising:

providing a plurality of tire monitors, each monitor for mounting in one of the plurality of tires, each monitor comprising a sensor for sensing tire pressure, a transmitter for transmitting a signal representative of the sensed tire pressure, and a sensor for sensing an impact to the tire and for actuating the transmitter to transmit a tire pressure signal in response thereto;

providing a receiver for mounting on-board the vehicle for receiving the tire pressure signals transmitted by the transmitters; and providing a controller for mounting on-board the vehicle and to be provided in communication with the receiver, the controller for processing tire pressure signals received by the receiver and for conveying tire pressure information to a user, wherein, to identify a tire location associated with a low tire pressure indiction conveyed by the controller, at least one tire is struck when the vehicle is stationary so that the associated impact sensor actuates the associated transmitter and, if the associated tire pressure signal transmitted represents a low tire pressure, the controller conveys confirmatory information that the at least one tire struck has low pressure.

17. The method of claim 16 wherein to convey confirmatory information, the controller is for use in generating an audible signal.

18. The method of claim 17 wherein the audible signal comprises activating a vehicle horn.

19. The method of claim 16 wherein to convey confirmatory information, the controller is for use in generating a visual signal.

20. The method of claim 19 wherein the visual signal comprises activating a vehicle light.

* * * * *